US011637061B2

(12) United States Patent
Huang et al.

(10) Patent No.: US 11,637,061 B2
(45) Date of Patent: Apr. 25, 2023

(54) ELECTRONIC DEVICE INCLUDING CONDUCTIVE ELEMENT AND EXTENDING ELEMENT WITH INSULATING LAYER DISPOSED THEREBETWEEN

(71) Applicant: InnoLux Corporation, Miao-Li County (TW)

(72) Inventors: Chiu-Yuan Huang, Miao-Li County (TW); Pei-Chieh Chen, Miao-Li County (TW); Yu-Ting Liu, Miao-Li County (TW); Tsung-Yeh Ho, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 337 days.

(21) Appl. No.: 16/993,291

(22) Filed: Aug. 14, 2020

(65) Prior Publication Data
US 2021/0074610 A1 Mar. 11, 2021

(30) Foreign Application Priority Data
Sep. 10, 2019 (CN) .......................... 201910855047.9

(51) Int. Cl.
*H01L 23/498* (2006.01)
*H05K 1/18* (2006.01)
*G02F 1/1333* (2006.01)
*H01R 12/77* (2011.01)
*H01L 51/00* (2006.01)
*H01R 12/70* (2011.01)

(52) U.S. Cl.
CPC .... *H01L 23/4985* (2013.01); *G02F 1/133305* (2013.01); *H01L 51/0097* (2013.01); *H01R 12/7076* (2013.01); *H01R 12/77* (2013.01); *H05K 1/189* (2013.01); *H05K 2201/09009* (2013.01); *H05K 2201/10128* (2013.01)

(58) Field of Classification Search
None
See application file for complete search history.

(56) References Cited

U.S. PATENT DOCUMENTS

| 2008/0084530 | A1 | 4/2008 | Hirabayashi | |
|---|---|---|---|---|
| 2011/0170274 | A1 | 7/2011 | Moriwaki | |
| 2011/0292313 | A1 | 12/2011 | Takenaka | |
| 2015/0227235 | A1 | 8/2015 | Lee | |
| 2017/0168360 | A1 | 6/2017 | Zhao | |
| 2017/0308192 | A1* | 10/2017 | Ogura | G06F 3/04164 |
| 2022/0254286 | A1* | 8/2022 | Kim | G09G 3/3291 |

FOREIGN PATENT DOCUMENTS

CN 104834398 A 8/2015

* cited by examiner

Primary Examiner — J. E. Schoenholtz
(74) Attorney, Agent, or Firm — Winston Hsu

(57) ABSTRACT

The present disclosure provides an electronic device including a substrate, a conductive element, an extending element and an insulating layer. The substrate includes an edge, the conductive element is disposed on the substrate, the extending element is disposed corresponding to at least a portion of the conductive element and extends to the edge of the substrate, and the insulating layer separates the conductive element and the extending element.

9 Claims, 9 Drawing Sheets

ELECTRONIC DEVICE INCLUDING CONDUCTIVE ELEMENT AND EXTENDING ELEMENT WITH INSULATING LAYER DISPOSED THEREBETWEEN

BACKGROUND OF THE DISCLOSURE

1. Field of the Disclosure

The present disclosure relates to an electronic device; more particularly, an electronic device capable of reducing damage to conductive elements.

2. Description of the Prior Art

Electronic devices are widely used in daily life, and they have become an indispensable part of the modern society. As developments of portable electronic devices continue, consumers would undoubtedly have higher expectations of their quality, functions or cost-to-performance ratio.

Even though the electronic devices currently on the market may fulfill their original design requirements, certain aspects of their function may still be lacking. Technical challenges still exist and need to be overcome for these electronic devices.

SUMMARY OF THE DISCLOSURE

An embodiment of the present disclosure provides an electronic device including a substrate, a conductive element, an extending element and an insulating layer. The substrate includes an edge, the conductive element is disposed on the substrate, the extending element is disposed corresponding to at least a portion of the conductive element and extends to the edge of the substrate, and the insulating layer separates the conductive element and the extending element.

These and other objectives of the present disclosure will no doubt become obvious to those of ordinary skill in the art after reading the following detailed description of the embodiment that is illustrated in the various figures and drawings.

DETAILED DESCRIPTION

Figure 1:
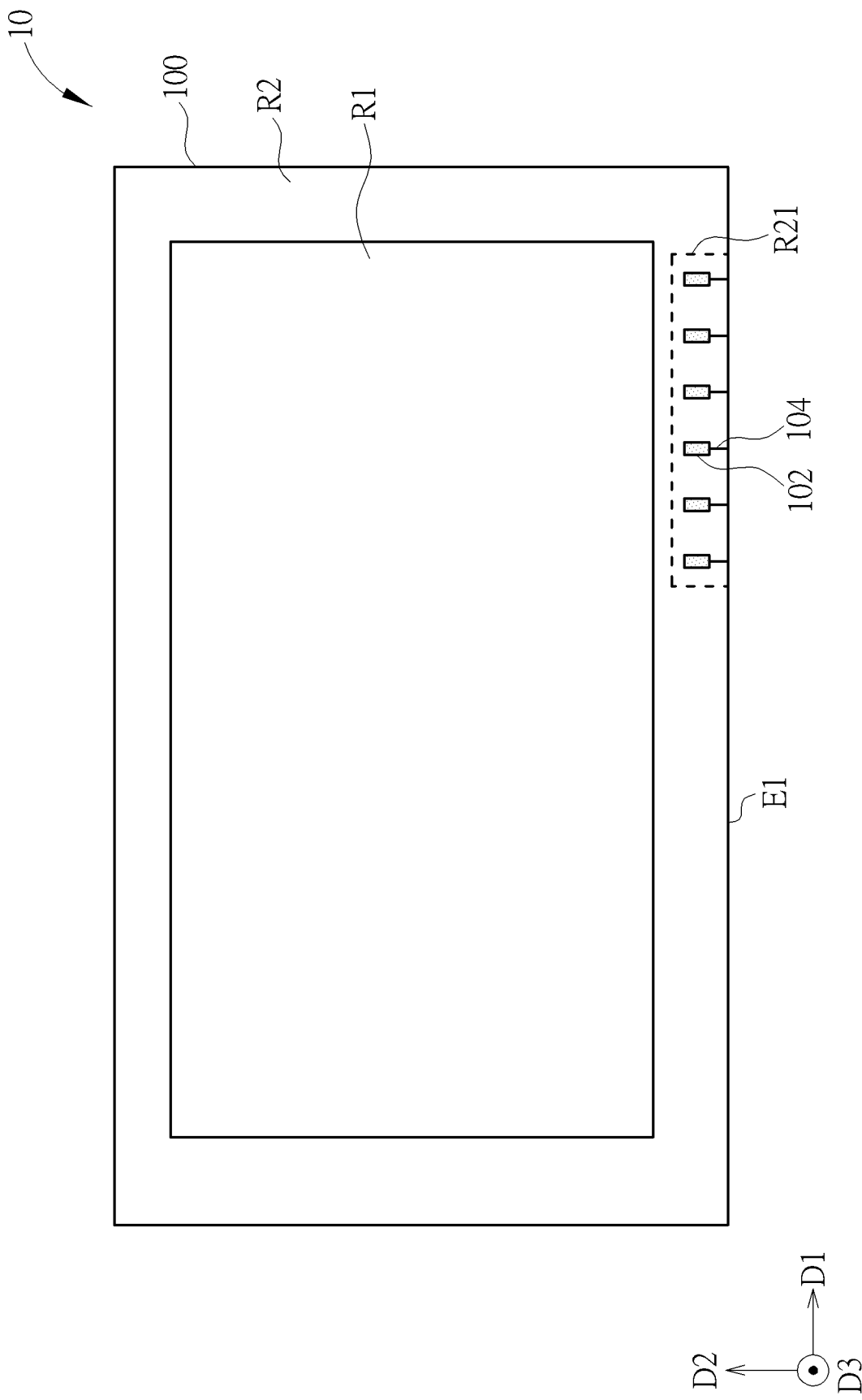
FIG. 1 is a top view of an electronic device according to a first embodiment of the present disclosure.

The present disclosure may be understood by reference to the following detailed description, taken in conjunction with the embodiments and drawings as described below. It is noted that, for purposes of illustrative clarity and being easily understood by the readers, various drawings of this disclosure may only partially illustrate an electronic device; certain components within may not be drawn to scale. In addition, the numbers and dimensions of each component shown in the drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not in function. In the following description and in the claims, the terms "include", "comprise" and "have" are used in an open-ended fashion, and thus should be interpreted to mean "include, but not limited to . . . ".

It will be understood that when an element or layer is referred to as being "on" or "connected to" another element or layer, it can be directly on or directly connected to the other element or layer, or intervening elements or layers may be presented (indirect case). In contrast, when an element is referred to as being "directly on" or "directly connected to" another element or layer, there are no intervening elements or layers presented.

The term "about", "substantially", "equal", or "same" generally refers to values or quantities falling within 20% of a given value or range, or within 10%, 5%, 3%, 2%, 1%, or 0.5% of a given value or range.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

It should be noted that the technical features in different embodiments described in the following description may be replaced, recombined, or mixed with one another to constitute another embodiment without departing from the spirit of the present disclosure.

An electronic device according to the present disclosure may include a display device, an antenna device, a sensing device, a light-emitting device, a tiled device, other suitable devices or a combination of the aforementioned devices, but not limited thereto. The electronic device may include foldable or flexible electronic devices. In one embodiment, the electronic device may include a display medium and/or a light-emitting unit. For example, the electronic device may include a liquid crystal layer or a light-emitting diode. The light-emitting diode may include organic light-emitting diodes (OLEDs), inorganic light-emitting diodes such as mini light-emitting diodes (mini LEDs) or micro light-emitting diodes (micro LEDs), quantum dots, quantum dot light-emitting diodes (quantum dot LEDs, QLEDs, QDLEDs), fluorescent materials, phosphorescent materials, other suitable materials or a combination of the above materials and devices, but not limited thereto. In the description below, a display device is illustrated as an example of the electronic device of the present disclosure, but the present disclosure is not limited thereto.

Please refer to FIG. 1, which shows a top view of an electronic device according to a first embodiment of the present disclosure. An electronic device 10 may include a substrate 100, at least one conductive element 102 and at least one extending element 104, but not limited thereto. The substrate 100 may include an operating region R1 and a peripheral region R2; the peripheral region R2 may for example be disposed on at least one side of the operating region R1. As shown in FIG. 1, the peripheral region R2 may surround the operating region R1. The operating region R1 may include a display region, a detecting region, a sensing region, a light-emitting region, or a combination thereof, but not limited thereto.

The substrate 100 may include a rigid substrate, a soft substrate (such as a bendable or deformable substrate) or a combination of the above, but not limited thereto. In some embodiments, materials of the substrate 100 may include plastics, glass, quartz, organic polymers, metals, ceramics, other suitable materials, or a combination of the above, but not limited thereto. If the material of the substrate 100 is an organic polymer, the material may for example include polyimide (PI), polyethylene terephthalate (PET), polycarbonate (PC) or a combination of the above, but not limited thereto.

As shown in FIG. 1, the substrate 100 may include a region R21, and the region R21 may be adjacent to an edge E1 of the substrate 100. For example, the region R21 may be located in the peripheral region R2 of the substrate 100, but not limited thereto. The conductive element 102 and the extending element 104 may be disposed on the substrate 100 and inside the region R21, and the conductive element 102 and the extending element 104 may be disposed adjacent to the edge E1 of the substrate 100. For example, the extending element 104 may extend to the edge E1 of the substrate 100. The region R21 may include a lead region (e.g. a trace region) and/or a bonding region, such as an outer lead bonding (OLB) region, but not limited thereto. The conductive element 102 may for example be connected to leads (not drawn) on the substrate 100, and allow the conductive element 102 to be electrically connected to components and elements in the electronic device 10, but not limited thereto. On the other hand, for example, during the production process of the electronic device 10, a plurality of electronic devices 10 may be manufactured together on a large size substrate, and the plurality of electronic devices 10 may subsequently be separated by a cutting process. During the production process of manufacturing the plurality of electronic devices 10 on the large size substrate, damages may occur in the conductive element 102 due to electrostatic charge accumulation; therefore, extending elements may be disposed for connecting to a grounding lead to release the electrostatic charge. The grounding lead and a portion of the extending element may be removed during the cutting process, and the extending element 104 of FIG. 1 may be the remaining portion of the extending element after the plurality of electronic devices 10 are separated, but the present disclosure is not limited thereto. In other embodiments, the extending element may have additional functions. Furthermore, the electronic devices 10 may not be manufactured together on the large size substrate; instead, a single electronic device 10 may be manufactured.

Figure 2:
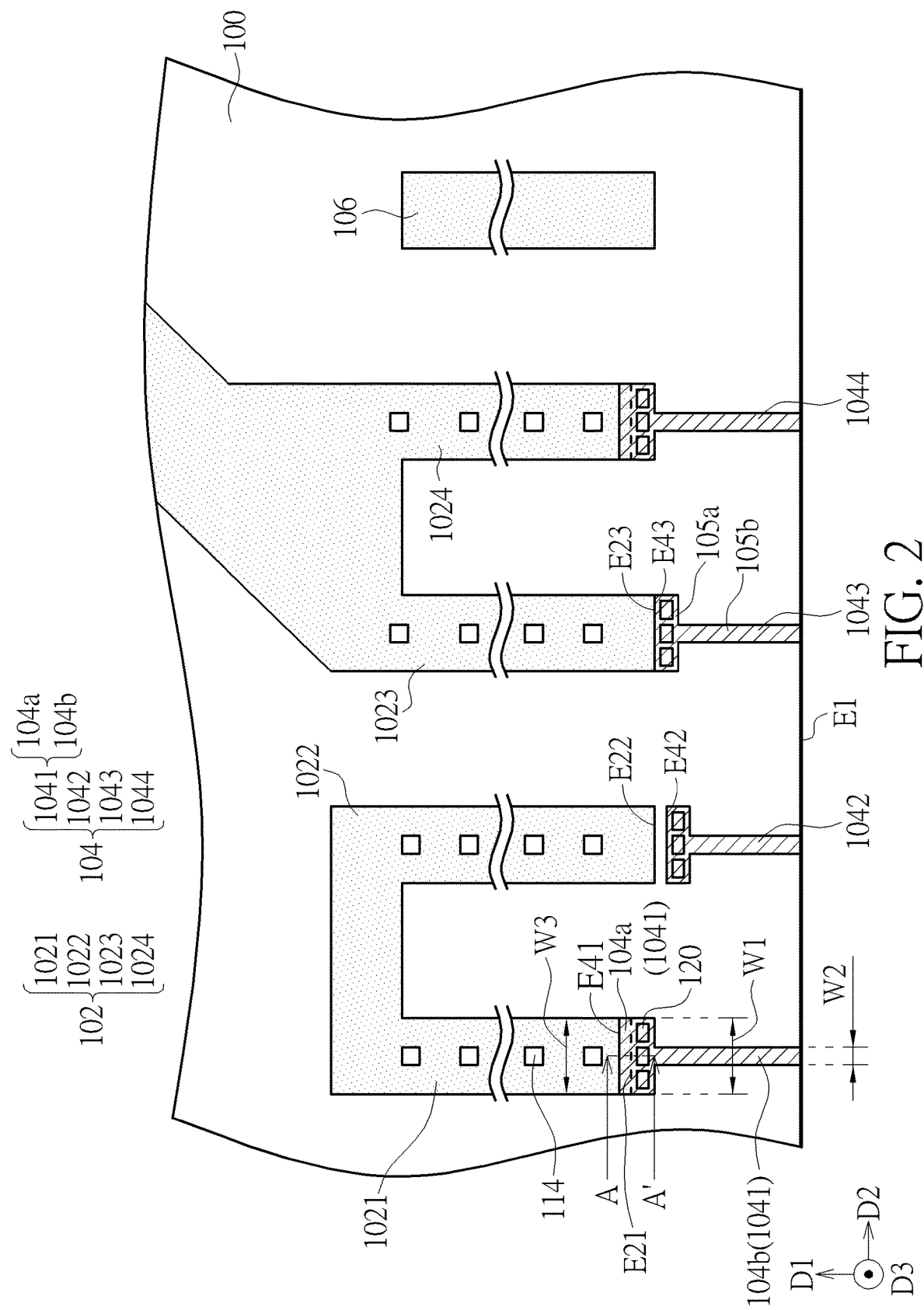
FIG. 2 is an enlarged schematic view of a conductive element and an extending element according to the first embodiment of the present disclosure.
Figure 3:
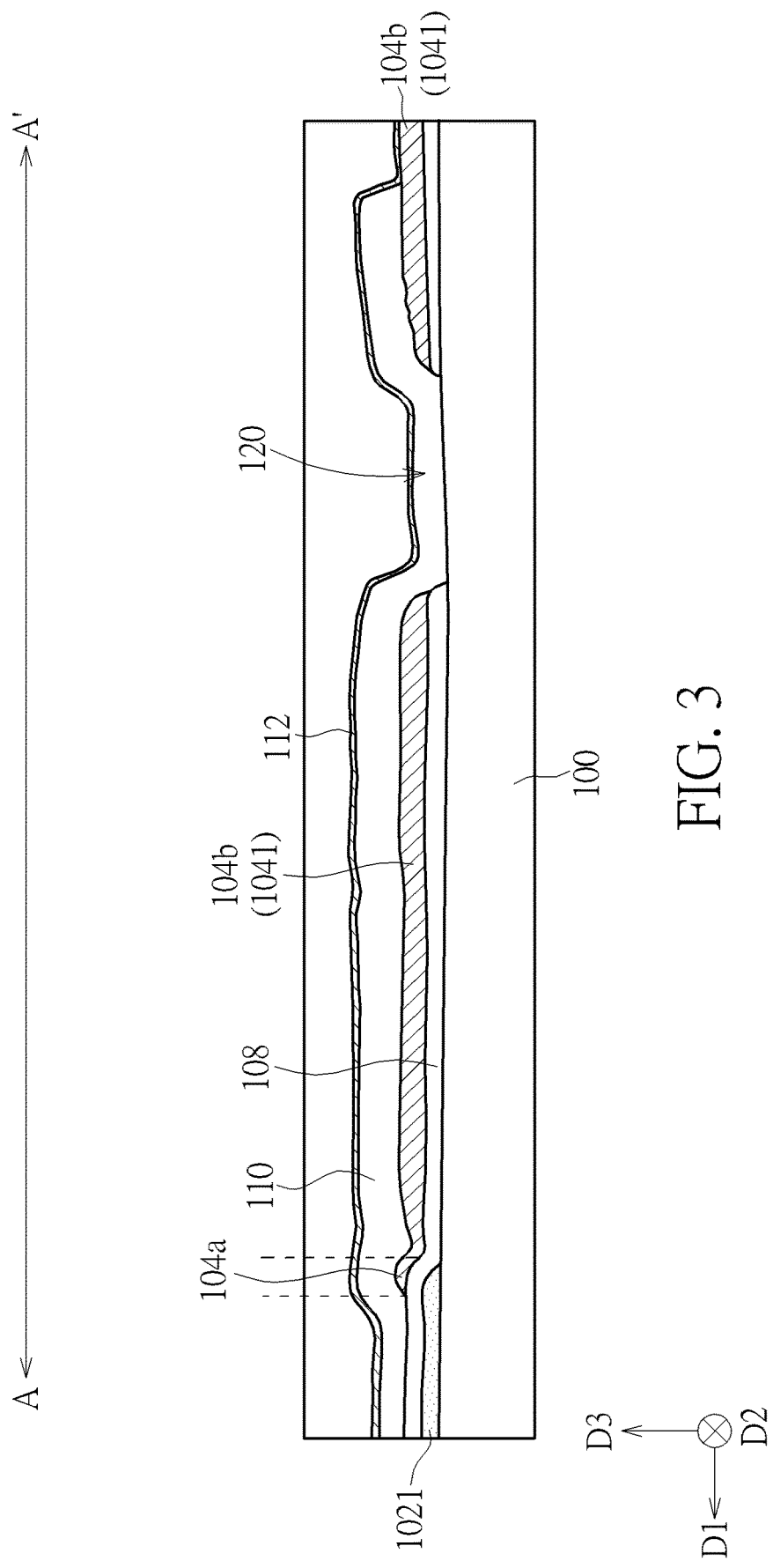
FIG. 3 is a schematic sectional view along a sectional line A-A' of FIG. 2.

Please refer to FIG. 2 and FIG. 3. FIG. 2 is an enlarged schematic view of the conductive element and the extending element according to the first embodiment of the present disclosure. To improve readability and clarity, FIG. 2 only shows the conductive elements 102 and the extending elements 104 on the substrate 100. Additionally, FIG. 3 is a schematic sectional view along a sectional line A-A' of FIG. 2. As shown in FIG. 2, the conductive elements 102 arranged from left to right may include a conductive element 1021 to a conductive element 1024, and the extending elements 104 arranged from left to right may include an extending element 1041 to an extending element 1044, but the quantity, sequence or shapes of the conductive elements 102 and the extending elements 104 are not limited thereto.

For example, the conductive element 1021 may be connected to the conductive element 1022, but not limited thereto; the conductive element 1021 and the conductive element 1022 may also be independent and separated from each other. The conductive element 1023 may be connected to the conductive element 1024 and extends diagonally (or obliquely) with the conductive element 1024, but not limited thereto; the conductive element 1023 may also not be connected to the conductive element 1024, and the conductive element 1023 and the conductive element 1024 may each extend diagonally and be independent from each other. Furthermore, one or more dummy conductive elements 106 may be disposed on the substrate 100, and the dummy conductive element 106 may be electrically isolated from the conductive elements and the extending elements, but not limited thereto.

At least one of the extending elements 1041 to the extending element 1044 may be disposed corresponding to at least a portion of one of the conductive elements 1021 to the conductive element 1024. For example, the extending element 1041 may be disposed corresponding to the conductive element 1021, but the present disclosure is not limited thereto. In other embodiments, a plurality of extending elements may correspond to one conductive element. A portion of the extending elements and/or a portion of the conductive elements may be independently disposed without a corresponding conductive element and/or a corresponding extending element.

At least one of the extending elements 1041 to the extending element 1044 may include a first portion 104a and a second portion 104b, but not limited thereto. As shown in FIG. 2, for example, the extending element 1041 may overlap a portion of the conductive element 1021, wherein a region of the extending element 1041 overlaps the conductive element 1021. The overlapping region may be defined as a first portion 104a (such as a region between an edge E41 of the extending element and an edge E21 of the conductive element), and another region of the extending element 1041 does not overlap the conductive element 1021, whereas the another region may be defined as a second portion 104b, but not limited thereto. The extending element 1044 may have the same features as the aforementioned extending element 1041, but not limited thereto.

In another embodiment, an edge E42 of the extending element 1042 may be disposed corresponding to an edge E22 of the conductive element 1022, the conductive element 1022 does not overlap the extending element 1042, and the edge E22 may be separated from the edge E42. A distance between the edge E22 and the edge E42 may be between 0.05 micrometers and 0.5 micrometers (0.05 micrometers ≤distance ≤0.5 micrometers), such as 0.1 micrometers, 0.2 micrometers, 0.3 micrometers, or 0.4 micrometers, but not limited thereto.

In another embodiment, an edge E43 of the extending element 1043 may be disposed corresponding to an edge E23 of the conductive element 1023, wherein the conductive element 1023 does not overlap the extending element 1043, and the edge E23 is substantially aligned with the edge E43. In other words, the extending element 1042 and the extending element 1043 may not overlap the conductive element 1022 and the conductive element 1023.

The aforementioned term "overlap" may refer to different film layers overlapping each other in a normal direction D3 of a surface of the substrate 100, but not limited thereto. Unless otherwise specified, the term "overlap" in the present disclosure refers to a "completely overlapping" configuration and a "partially overlapping" configuration.

In some embodiments (as shown in FIG. 2), the shape of the extending element 104 may be a "T" shape or other suitable shapes, but not limited thereto. Using the extending element 1041 as an illustrative example, the first portion 104a may have a first width W1, the second portion 104b may have a second width W2, and the second width W2 may be less than the first width W1. In the present disclosure, the first width W1 may be the minimum width of the first portion 104a, the second width W2 may be the minimum width of the second portion 104b. Furthermore, in one embodiment, the width of the extending element 1041 (such as the first width W1 or the second width W2) may be less than or equal to a width W3 of the conductive element 1021. For example, the first width W1 of the extending element 1041 may be substantially equal to the width W3 of the conductive element 1021, but not limited thereto.

The width W3 of the conductive element 1021 and the width of the extending element 1041 (such as the first width W1 or the second width W2) may for example be measured by first taking the edge E21 of the conductive element 1021 as a basis, then, defining a maximum width of the conductive element 1021 measured within a range of 200 micrometers from the edge E21 along a first direction D1 (such as an extension direction of the extending element 1041) as the width W3, and defining a minimum width of the extending element 1041 measured within a range of 200 micrometers from the edge E21 along a direction opposite to the first direction D1 as the width of the extending element 1041, but not limited thereto.

In other embodiments, the extending element 1042 and the extending element 1043 may respectively include a third portion 105a and a fourth portion 105b. A minimum width of the third portion 105a may be greater than a maximum width of the fourth portion 105b, but not limited thereto. The fourth portion 105b may be disposed between the third portion 105a and the edge E1 of the substrate 100.

Configuring the second width W2 of the second portion 104b of the extending element 1041 to be less than the first width W1 of the first portion 104a may reduce the area of the extending element 1041 exposed at the edge E1 of the substrate 100, thereby reducing the probability of corrosion due to moisture and oxygen. On the other hand, configuring the second portion 104b to be closer to the edge E1 of the substrate 100 and with a narrow width increases the resistivity of the second portion 104b, and the electrostatic charges are less likely to pass through the second portion 104b. For example, when an excessive number of electrostatic charges accumulate at the second portion 104b, the second portion 104b may be more likely to be damaged by static electricity, whereas the first portion 104a or the conductive element 1021 away from the edge E1 are less likely to be damaged by the static electricity; in this manner, the conductive element 1021 may be protected. The advantages described above are for illustrative purposes only; contents of the present disclosure are not limited thereto, and additional advantages or functions may be present depending on product design or requirements.

As shown in FIG. 3, in some embodiments, the conductive element 1021 may include a first conductive layer, the extending element 1041 may include a second conductive layer, the first conductive layer may be disposed on the substrate 100, and the second conductive layer may be disposed on the first conductive layer, but not limited thereto. The first conductive layer and the second conductive layer of the present embodiment may for example include a metal layer, but not limited thereto. Materials of the first conductive layer and the second conductive layer may include metals, transparent conductive materials or a combination of the abovementioned materials, but not limited thereto.

The abovementioned transparent conductive materials may include indium tin oxide (ITO), indium zinc oxide (IZO), indium gallium zinc oxide (IGZO), indium tin zinc oxide (ITZO), antimony tin oxide (ATO), antimony zinc oxide (AZO), other suitable transparent conductive materials or a combination of the abovementioned materials, but not limited thereto.

The aforementioned metals may include copper (Cu), aluminum (Al), titanium (Ti), gold (Au), tin (Sn), silver (Ag), molybdenum (Mo), silicon (Si), other suitable metals or a combination of the abovementioned materials, but not limited thereto. Additionally, the conductive element 1021 and/or the extending element 1041 of FIG. 3 may include a single-layer structure, but not limited thereto. In other embodiments, the conductive element 1021 and/or the extending element 1041 may include a multi-layer structure.

As shown in FIG. 3, in the normal direction D3 of the surface of the substrate 100, the insulating layer 108 may be disposed on the substrate 100 and be disposed between the conductive element 1021 and the extending element 1041. In other words, the insulating layer 108 may separate the conductive element 1021 and the extending element 1041. A thickness of the insulating layer 108 may be between 0.05 micrometers and 0.7 micrometers (0.05 micrometers ≤thickness ≤0.7 micrometers), such as 0.1 micrometers, 0.2 micrometers, 0.3 micrometers, 0.4 micrometers, or 0.5 micrometers, but not limited thereto and may be adjusted depending on practical demands. In some embodiments, the thickness may be a maximum thickness in the normal direction D3 of the substrate 100 in any given sectional view.

An insulating layer 110 may be disposed on the second conductive layer (the extending element 1041). Materials of the insulating layer 108 and the insulating layer 110 may include silicon oxide, silicon nitride, other suitable insulating materials or a combination of the abovementioned materials, but not limited thereto. Since the conductive element 1021 and the extending element 1041 may be separated by the insulating layer 108, and the conductive element 1021 may be covered by the insulating layer 108, the insulating layer 108 may provide a protective barrier for the conductive element 1021, for example, to reduce the probability of the conductive element 1021 being corroded by moisture and oxygen. The insulating layer 108 and/or the insulating layer 110 may include a single-layer structure, but not limited thereto. In other embodiments, the insulating layer 108 and/or the insulating layer 110 may include a multi-layer structure.

As shown in FIG. 3, the conductive layer 112 may be disposed on the insulating layer 110; for example, the conductive layer 112 may extend from above the conductive element 1021 of FIG. 2 to above the first portion 104a and the second portion 104b of the extending element 1041, but not limited thereto. In one embodiment, the conductive layer 112 may at least partially expose an area above the second portion 104b, but not limited thereto. In one embodiment, materials of the conductive layer 112 may include metals or transparent conductive materials, but not limited thereto. The conductive layer 112 may protect the conductive element 1021 (such as to reduce corrosion), but not limited thereto.

Furthermore, the first portion 104a of the extending element 104 may include at least one opening, but not limited thereto. As shown in FIG. 2 and FIG. 3, the second portion 104b of the extending element 1041 may include a plurality of openings 120, and the opening 120 may for example be arranged along a second direction D2, but not limited thereto. In other embodiments, the opening 120 may be arranged in a matrix, such as an M×N matrix (for example, a 1×5, 2×2, or 3×2 matrix), and M and N may be integers greater than or equal to 1, but not limited thereto. The first direction D1 may be different from the second direction D2; for example, the first direction D1 may substantially be perpendicular to the second direction D2, but not limited thereto. The opening 120 may penetrate the second conductive layer (the extending element 1041) and the insulating layer 108, and the insulating layer 110 may partially or completely fill the opening 120, but not limited thereto. Disposing the openings 120 inside the extending element 1041 may slow the ingress of moisture and oxygen, thereby protecting the conductive element 1021.

On the other hand, the conductive element 102 may include at least one contact hole, but not limited thereto. As shown in FIG. 2, the conductive element 1021 may include a plurality of contact holes 114, and the contact holes 114 may for example be arranged along an extension direction of the conductive element 102, but not limited thereto. The contact holes 114 may for example penetrate the insulating layer 108 and the insulating layer 110 on the conductive element 1021 of FIG. 3 and expose the conductive element 1021, and the conductive element 1021 may be electrically connected to a bonding pad of other electrical elements (such as an integrated circuit chip, a flexible circuit board, etc.), but not limited thereto. In one embodiment, the conductive element 1021 may be connected to the conductive layer 112 through the contact holes 114, and the conductive element 1021 may be electrically connected to other electrical elements through the conductive layer 112.

The abovementioned features of the conductive element 1021 and the extending element 1041 may be applied to at least one of the remaining conductive elements 1022 to the conductive elements 1024 of FIG. 2 and at least one of the remaining extending elements 1042 to the extending elements 1044 of FIG. 2, and further description is omitted herein for simplicity. Additionally, structures of the electronic device 10 are not limited to those shown in sectional views of the present disclosure (such as FIG. 3 and subsequent FIG. 7 and FIG. 9); in the sectional views, other suitable film layers may be disposed between different film layers or disposed above the top film layer depending on various design requirements.

Descriptions below will detail other embodiments of the present disclosure; for simplicity, identical reference signs will be used for identical components. To emphasize differences between various embodiments, the following paragraphs will focus on describing such differences between the various embodiments and will not describe redundant technical features.

Figure 4:
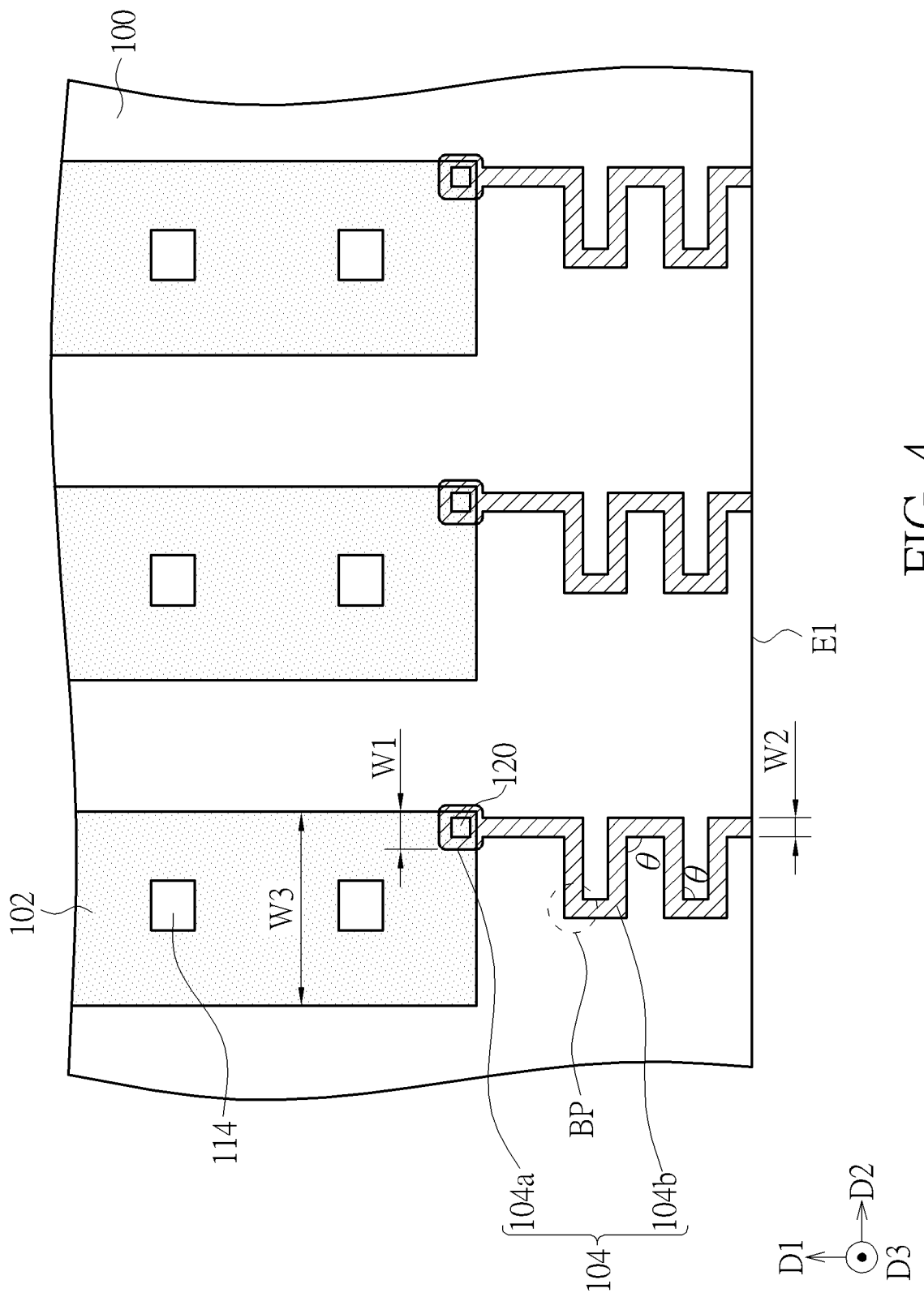
FIG. 4 is an enlarged schematic view of the conductive element and the extending element according to a second embodiment of the present disclosure.

Please refer to FIG. 4, which is an enlarged schematic view of the conductive element and the extending element according to a second embodiment of the present disclosure. The present embodiment differs from the first embodiment in that, the extending element 104 of the present embodiment includes at least one bent region. As shown in FIG. 4, the second portion 104b of the extending element 104 may include a plurality of bent regions BP, and the shape of the second portion 104b may be similar to a winding extended hose, but not limited thereto. In the present embodiment, the extending element 104 includes the bent regions BP that substantially extend in the first direction D1 (as shown in FIG. 4). Electrostatic charges accumulate more easily in the bent regions BP, and when an excessive number of electrostatic charges accumulate at the bent regions BP, the bent regions BP may be damaged by static electricity first, and the first portion 104a or the conductive element 102 away from the edge E1 are less likely to be damaged by the static electricity, and the conductive element 102 may be protected.

Furthermore, the width of the extending element 104 of the present embodiment (such as the first width W1 and/or the second width W2) may be less than the width W3 of the conductive element 102, but not limited thereto. In one embodiment, the bent region BP may have an angle θ, and the range of the angle θ may be between 30° to 120° (30°≤angle θ≤120°), such as 45°, 60°, 75°, 90°, or 105°, but not limited thereto.

Figure 5:
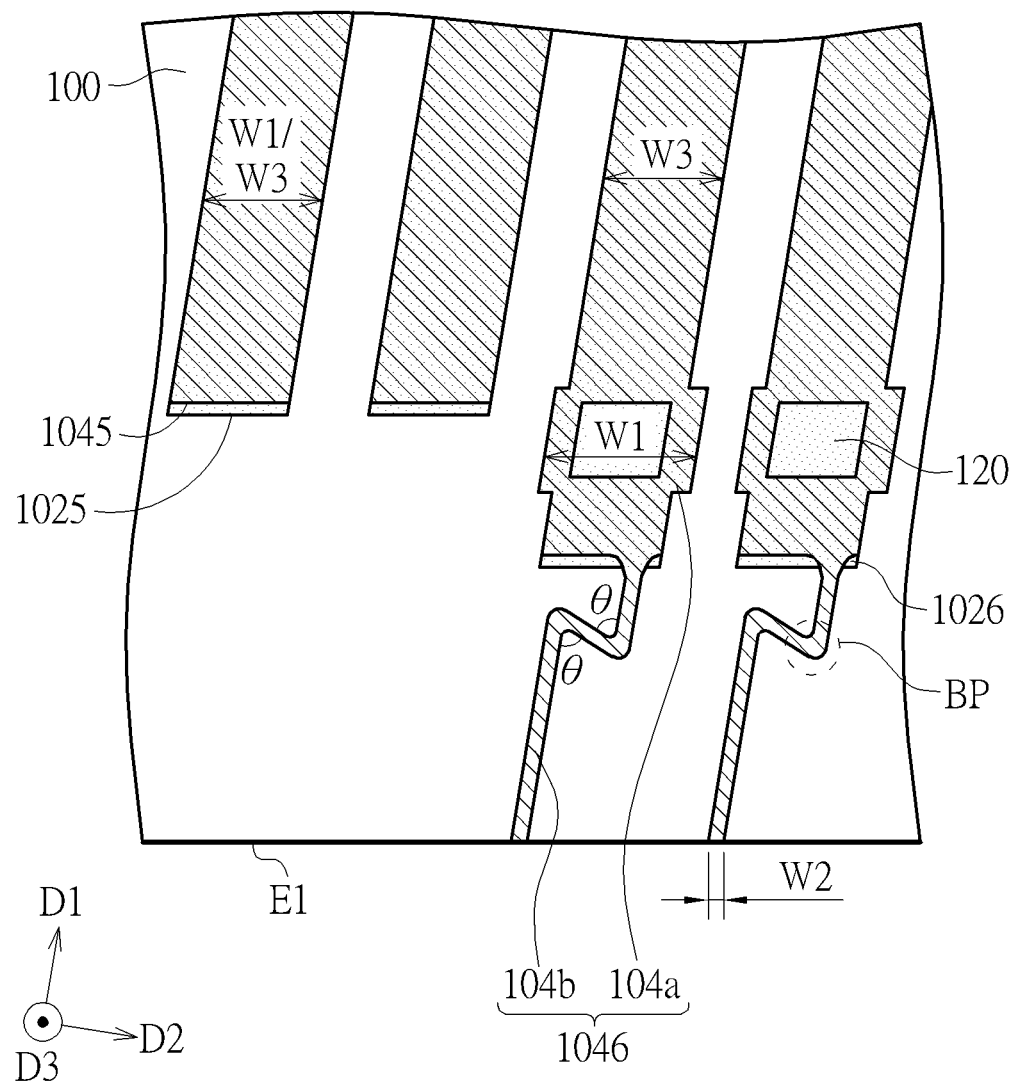
FIG. 5 is an enlarged schematic view of the conductive element and the extending element according to a third embodiment of the present disclosure.

Please refer to FIG. 5, which is an enlarged schematic view of the conductive element and the extending element according to a third embodiment of the present disclosure. The present embodiment differs from the first embodiment in that, extending elements 1045 and extending elements 1046, respectively, may extend along and overlap the conductive elements 1025 and the conductive elements 1026. The extending element 1045 may not have the second portion 104b and/or the opening 120 of the extending element 104 in the first embodiment, but not limited thereto. The second portion 104b of the extending element 1046 may include a plurality of bent regions BP, but not limited thereto. Furthermore, the first width W1 of the extending element 1045 and the extending element 1046 of the present embodiment may respectively be greater than or equal to the width W3 of the conductive element 1025 and the conductive element 1026, but not limited thereto. In one embodiment, the width may be a maximum width perpendicular to the first direction D1. In one embodiment, the bent region BP may have an angle θ, and the range of the angle θ may be between 30° to 120° (30°≤angle θ≤120°), such as 45°, 60°, 75°, 90°, or 105°, but not limited thereto.

Figure 6:
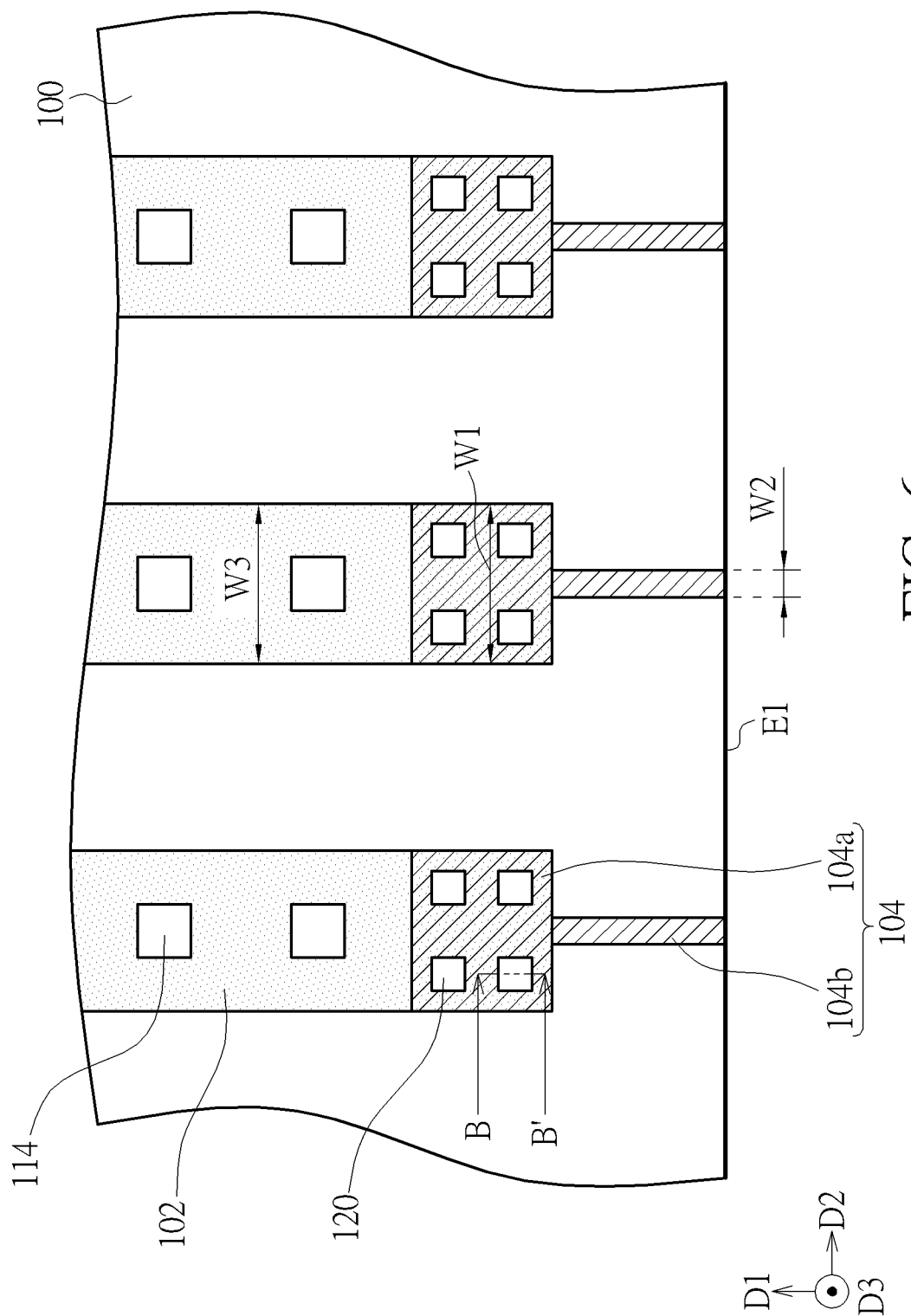
FIG. 6 is an enlarged schematic view of the conductive element and the extending element according to a fourth embodiment of the present disclosure.
Figure 7:
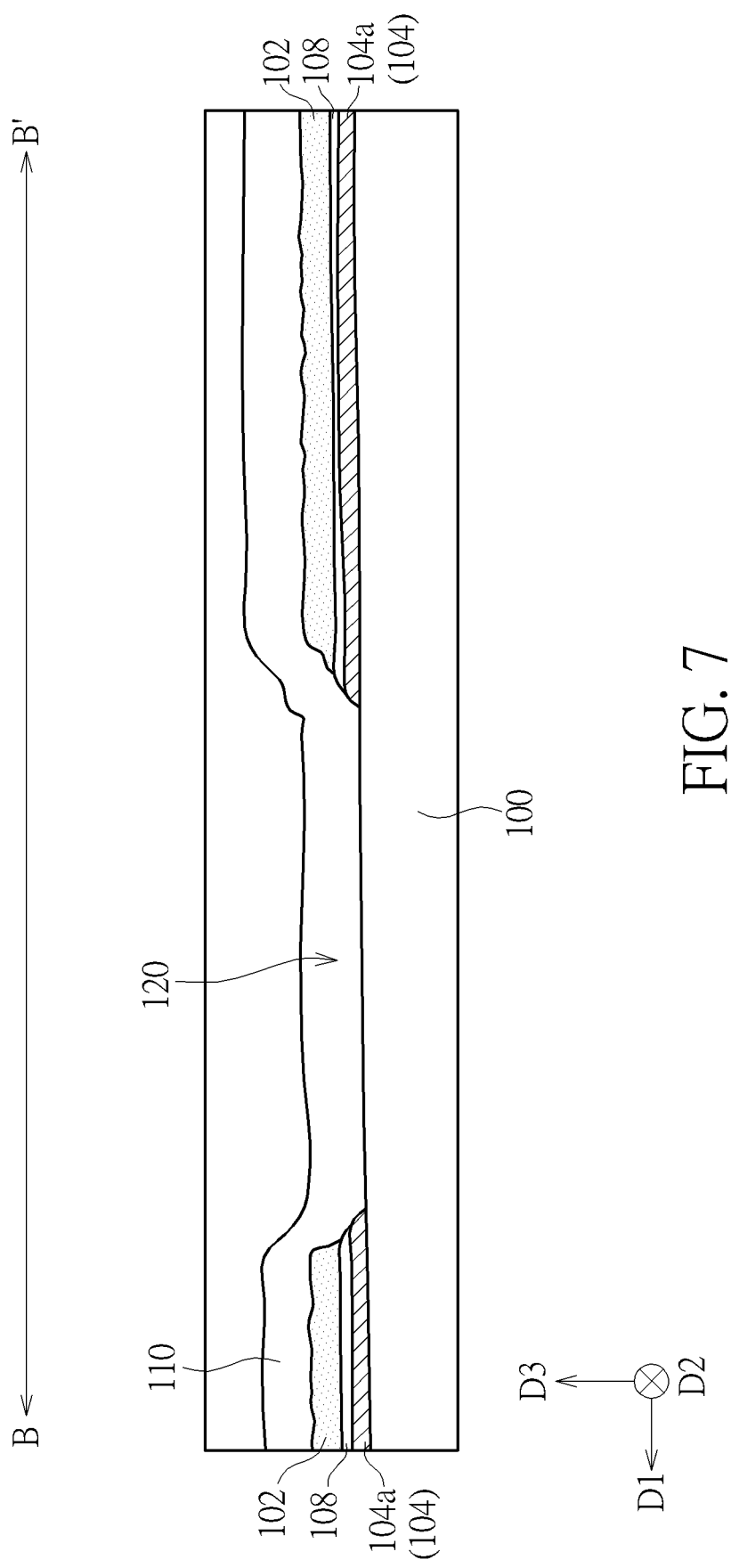
FIG. 7 is a schematic sectional view along a sectional line B-B' of FIG. 6.

Please refer to FIG. 6 and FIG. 7. FIG. 6 is an enlarged schematic view of the conductive element and the extending element according to a fourth embodiment of the present disclosure, and FIG. 7 is a schematic sectional view along a sectional line B-B' of FIG. 6. The present embodiment differs from the first embodiment in that, in FIG. 6, the openings 120 disposed in the first portion 104a of the extending element 104 are arranged in a matrix, but not limited thereto. Additionally, as shown in FIG. 7, the extending element 104 of the present embodiment may include the first conductive layer, the conductive element 102 may include the second conductive layer, and the second conductive layer is disposed on the first conductive layer, but not limited thereto. In one embodiment, as shown in FIG. 6 and FIG. 7, the first portion 104a of the extending element 104 may overlap the conductive element 102, the opening 120 may penetrate the conductive element 102, the insulating layer 108 and the first portion 104a of the extending element 104, and the insulating layer 110 may partially or completely fill the opening 120, but not limited thereto.

Figure 8:
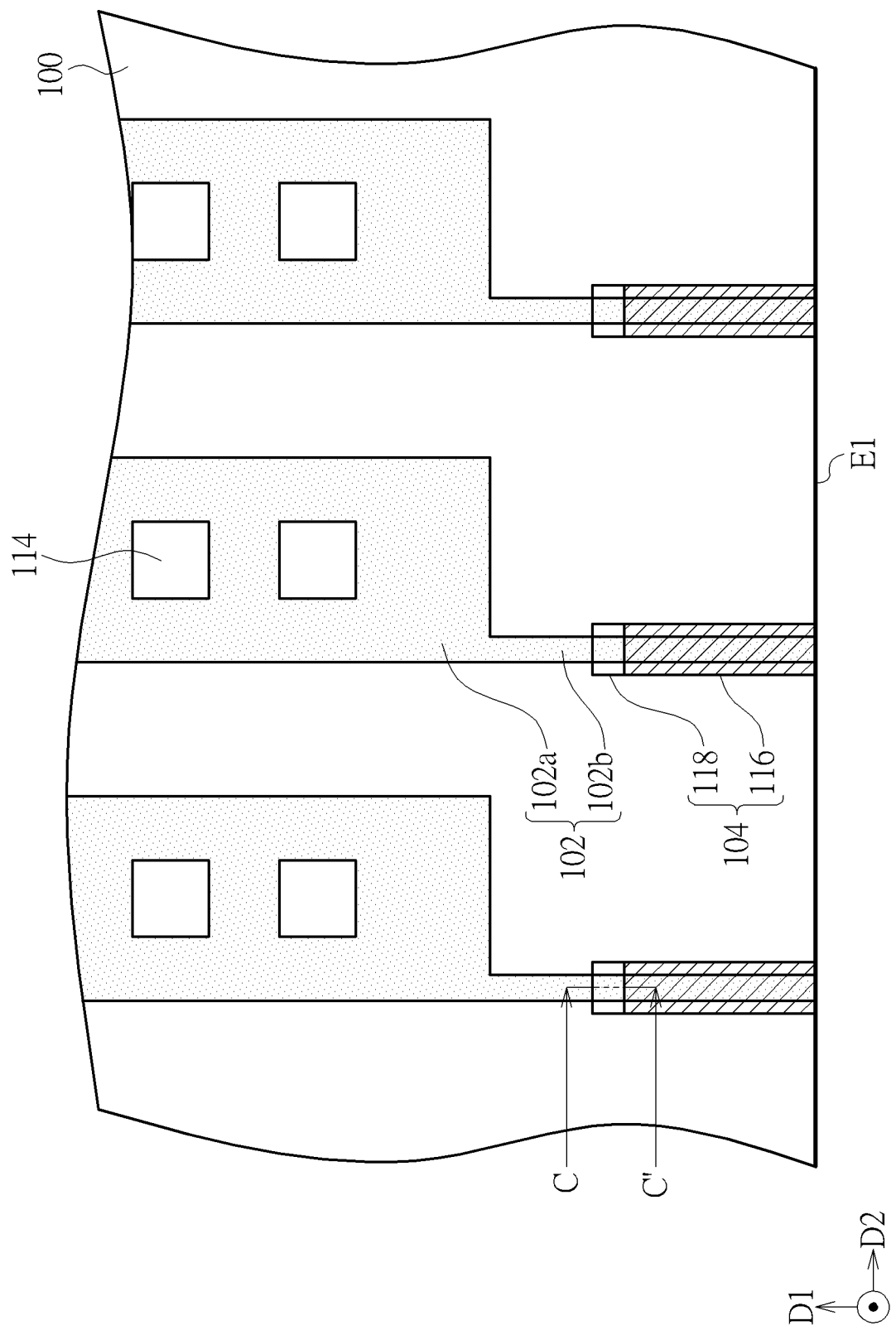
FIG. 8 is an enlarged schematic view of the conductive element and the extending element according to a fifth embodiment of the present disclosure.
Figure 9:
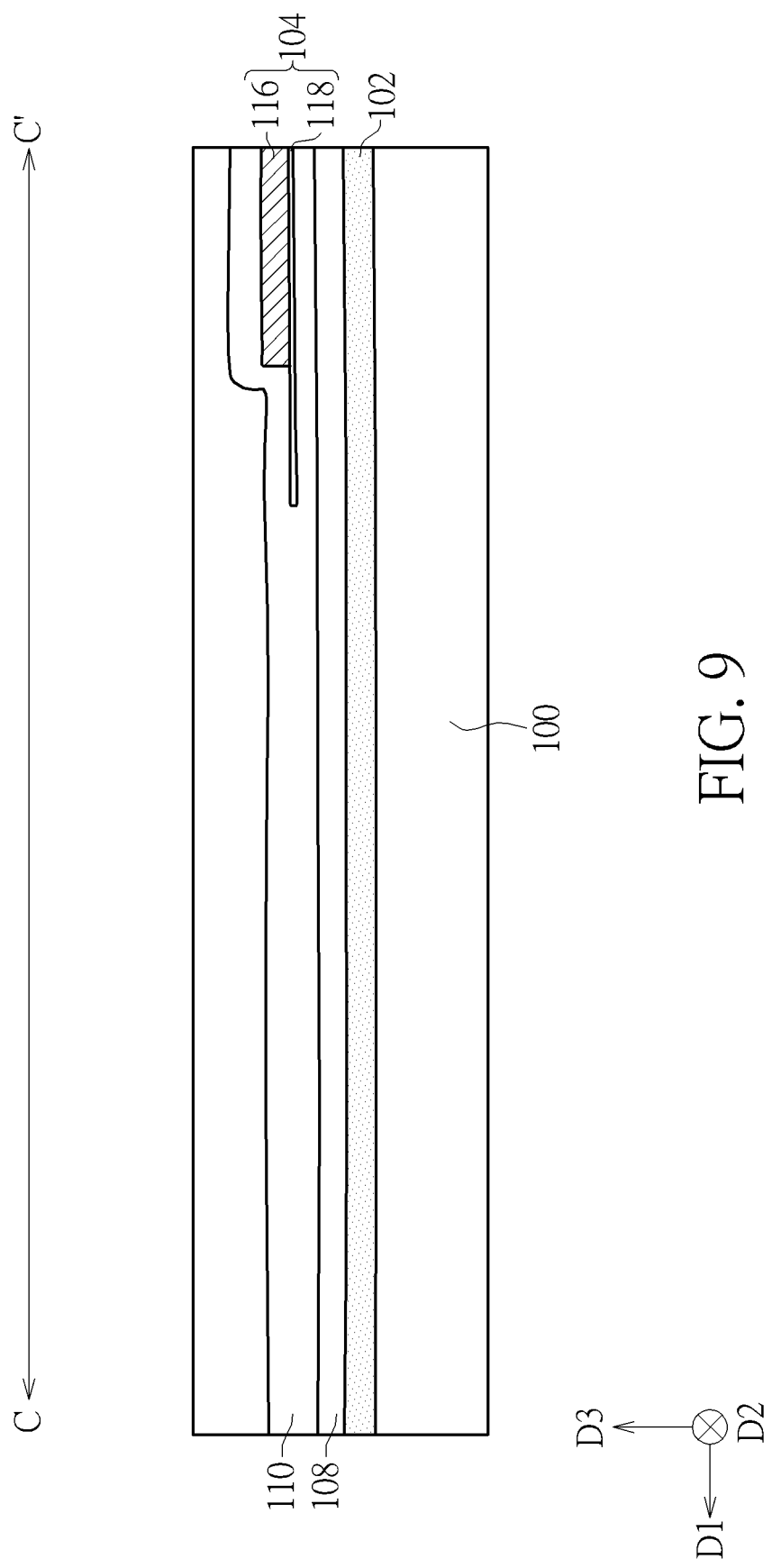
FIG. 9 is a schematic sectional view along a sectional line C-C' of FIG. 8.

Please refer to FIG. 8 and FIG. 9. FIG. 8 is an enlarged schematic view of the conductive element and the extending element according to a fifth embodiment of the present disclosure, and FIG. 9 is a schematic sectional view along a sectional line C-C' of FIG. 8. The present embodiment differs from the first embodiment in that, the conductive element 102 of the present embodiment (as shown in FIG. 8) may include a main portion 102a and a protrusion portion 102b. The protrusion portion 102b may be disposed between the main portion 102a and the edge E1 of the substrate 100, and the protrusion portion 102b may extend to the edge E1, but not limited thereto. A width of the main portion 102a may be greater than a width of the protrusion portion 102b, but not limited thereto. The contact holes 114 may be disposed inside the main portion 102a, but not limited thereto. For example, the protrusion portion 102b of the conductive element 102 may serve as a testing lead during the production process of the electronic device 10, and a portion of the lead may be removed during the cutting process, whereas the protrusion portion 102b of FIG. 8 may be a portion of the remaining lead after the electronic device 10 is cut and separated.

In the present embodiment (as shown in FIG. 8 and FIG. 9), the extending element 104 may overlap the protrusion portion 102b of the conductive element 102. In one embodiment, the extending element may only have a portion that overlaps the conductive element 102. The extending element 104 may extend to the edge E1 along the protrusion portion 102b of the conductive element 102, but not limited thereto. The extending element 104 may include a multi-layer structure. For example, the extending element 104 may include a conductor layer 116 and a semiconductor layer 118, and the conductor layer 116 may be disposed on the semiconductor layer 118. A portion of the semiconductor layer 118 may overlap the conductor layer 116, but not limited thereto. At least one of the conductor layer 116 and the semiconductor layer 118 may extend to the edge E1 of the substrate 100.

For example, the conductor layer 116 may include a metal layer, whereas the semiconductor layer 118 may include an indium gallium zinc oxide (IGZO) layer, an amorphous semiconductor layer, a polycrystalline semiconductor layer, or other suitable semiconductor layers, but not limited thereto. Furthermore, the extending element 104 of the present embodiment may not have the opening 120 of the first embodiment, but not limited thereto. In the present embodiment (as shown in FIG. 9), the extending element 104 may be disposed between the insulating layer 110, but not limited thereto. The insulating layer 110 may include a silicon oxide layer, whereas the insulating layer 108 may include a silicon nitride layer, but not limited thereto.

In summary, the conductive elements and the extending elements of the electronic device of the present disclosure may be separated by the insulating layer, and the conductive elements may be covered by the insulating layer; in this manner, the insulating layer may provide the protective effect to the conductive elements, for example, by reducing the probability of the conductive element being corroded by moisture and oxygen.

Even though embodiments and advantages of the present disclosure have been described as above, it should be understood that those skilled in the art may modify, substitute or amend features of the present disclosure depending on design requirements without departing from the essence and scope of the present disclosure, so long as an essence of the disclosure is maintained.

Additionally, the scope of the present disclosure is not limited to the production process, equipment, manufacture, composition, device, method or procedure outlined for a particular embodiment within the description. Those skilled in the art may infer from the content of the present disclosure about the production process, equipment, manufacture, composition, device, method or procedure, that are currently available or may be developed in the future, so long as the embodiments described herein may be used to realize substantially similar functions or outcome.

Therefore, the scope of protection of the present disclosure includes the aforementioned production process, equipment, manufacture, composition, device, method or procedure. Furthermore, every claim constitutes a separate embodiment, and the scope of the present disclosure also includes combinations of every claim and embodiment. The scope of the present disclosure is defined by the claims herein. Any one embodiment or claim of the present disclosure does not need to contain all of the advantages, features or meet all of the aims or goals of the present disclosure.

What is claimed is:

1. An electronic device, comprising:
   a substrate, comprising an edge;
   a conductive element disposed on the substrate;
   an extending element disposed corresponding to at least a portion of the conductive element and extending to the edge of the substrate; and
   an insulating layer separating the conductive element and the extending element,
   wherein a region of the extending element overlapping the conductive element is defined as a first portion, the first portion has a first width, another region of the extending element not overlapping the conductive element is defined as a second portion, the second portion has a second width, and the second width is less than the first width.

2. The electronic device of claim 1, wherein the first portion of the extending element comprises at least an opening.

3. The electronic device of claim 1, wherein the extending element comprises at least one bent region.

4. The electronic device of claim 3, wherein the at least one bent region has an angle, and the angle is greater than or equal to 30° and less than or equal to 120°.

5. The electronic device of claim 1, wherein the extending element comprises a metal layer and a semiconductor layer, and the metal layer is disposed on the semiconductor layer.

6. The electronic device of claim 1, wherein the insulating layer comprises a single-layer structure or a multi-layer structure.

7. The electronic device of claim 1, wherein the conductive element comprises at least a contact hole.

8. An electronic device, comprising:
   a substrate, comprising an edge;
   a conductive element disposed on the substrate;
   an extending element disposed corresponding to at least a portion of the conductive element and extending to the edge of the substrate; and
   an insulating layer separating the conductive element and the extending element,
   wherein the extending element comprises a metal layer and a semiconductor layer, and the metal layer is disposed on the semiconductor layer.

9. An electronic device, comprising:
a substrate, comprising an edge;
a conductive element disposed on the substrate;
an extending element disposed corresponding to at least a portion of the conductive element and extending to the edge of the substrate; and
an insulating layer separating the conductive element and the extending element, wherein the conductive element comprises at least a contact hole.

* * * * *